United States Patent [19]

Provost

[11] Patent Number: 5,109,854
[45] Date of Patent: May 5, 1992

[54] ROLL-OVER ALIASING SUPPRESSION IN UNDERSAMPLED IMAGES

[75] Inventor: Terence J. Provost, Cleveland Hts., Ohio

[73] Assignee: Picker International, Inc., Highland Hts., Ohio

[21] Appl. No.: 484,690

[22] Filed: Feb. 23, 1990

[51] Int. Cl.$^5$ ............................................. A61B 5/055
[52] U.S. Cl. .................. 128/653.2; 324/309; 324/312
[58] Field of Search .................. 128/653 A; 324/309, 324/312; 364/413.16–413.20; 326/54; 358/138; 375/122

[56] References Cited

U.S. PATENT DOCUMENTS

| | | | |
|---|---|---|---|
| 4,644,280 | 2/1987 | Patiel | 324/309 |
| 4,748,411 | 5/1988 | Holland | 324/309 |
| 4,771,242 | 9/1988 | Lampman et al. | 324/309 |
| 4,891,595 | 1/1990 | Granot | 324/309 |
| 4,901,019 | 2/1990 | Wedeen | 382/54 |
| 4,902,972 | 2/1990 | Takeda et al. | 324/309 |
| 4,949,040 | 8/1990 | Proska | 324/307 |
| 4,959,611 | 9/1990 | Provost et al. | 324/309 |

OTHER PUBLICATIONS

"FRODO Pulse Sequences: A New Means of Eliminating Motion, Flow and Wraparound Artifacts", by Edelman et al., Radiology, 1988, pp. 231–236.

"Rapid Local Rectangular Views and Magnifications: Reduced Phase Encoding of Orthogonally Excited Spin Echoes", by Conturo et al., Mag. Res. in Med., 6, pp. 418–429 (1988).

"A New Method for Multislice Zoom MR Imaging", by Purdy et al., pp. 231–232.

"Inner Volume MR Imaging: Technical Concepts and Their Application", by Feinberg et al., Radiology, vol. 156, No. 3, pp. 743–747, Sep. 1985.

Two to One Cartesion Hybrid Imaging, Kashmar et al., SMRM Book of Abstracts, Aug. 20–26, 1988, p. 1007.

Zonally Magnified EPI in Real Time by NMR, Mansfield et al., Journal of Physics E./Sci. Instru., vol. 21, No. 3, Mar. 1988, pp. 275–280.

*Primary Examiner*—Ruth S. Smith
*Attorney, Agent, or Firm*—Fay, Sharpe, Beall, Fagan, Minnich & McKee

[57] ABSTRACT

A fully sampled data set is generated and stored in a fully sampled memory (42). An undersampled data set corresponding to a portion of the same field of view as the fully sampled data set is generated and stored in an undersampled data memory (62). The fully sampled data set includes a frequency encoded data line corresponding to each of the phase encode gradient steps or angles required to span the selected field of view with a selected resolution. The undersampled data set includes data lines with only a fraction of the phase encoding steps or angles. The fully sampled data set is Fourier transformed (44) into a fully sampled image representation (50) and stored in a fully sampled image memory (46). The undersampled data is Fourier transformed (44) into an undersampled image representation (66) and stored in an undersampled image memory (64). The undersampled image (FIG. 2B) from the views of the undersampled data set between boundaries (58a, 58b) includes a representation of the tissue (52a, 52b, 54) within these boundaries as well as a representation from tissue (52c, 52d) outside of the boundaries superimposed thereon. Portions (72, 74) of the fully sampled image representing tissue outside of the undersampled image are translated and combined (86) and subtracted (88) from the undersampled image representation to generate a corrected undersampled image (90) for display on a video monitor (48). In this manner, a portion of fully sampled image representation that is free of roll-over artifacts is utilized to correct an undersampled, incomplete image representation of the same region that includes the roll-over artifacts.

17 Claims, 3 Drawing Sheets

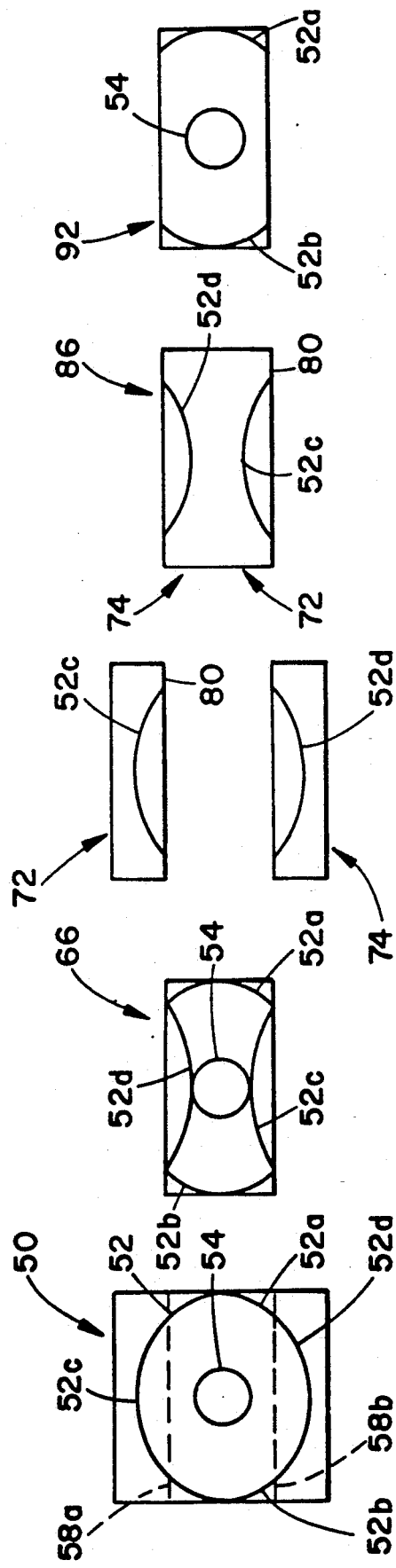

ROLL-OVER ALIASING SUPPRESSION IN UNDERSAMPLED IMAGES

BACKGROUND OF THE INVENTION

The present invention relates to the signal processing art. It finds particular application in conjunction with magnetic resonance image reconstruction and will be described with particular reference thereto. It is to be appreciated, however, that the invention will also find utility in other signal processing techniques in which undersampled signals are processed by transforms or other mathematical operations that are cyclically repeating, e.g. Fourier transforms.

For rapid data acquisition, such as single shot cardiac imaging, rectangular fields of view are often used to reduce the data acquisition time. More specifically to cardiac imaging, a typical field of view might be defined by the boundaries of the patient's torso. The heart, of course, only occupies a fraction of this field of view. The size of the field of view is related to the amount which the phase encoding gradient is stepped, incremented or decremented, between adjacent views. By appropriately selecting the phase encode gradient steps, data generation and collection can be limited to the half, quarter, or other fraction of the whole torso field of view, i.e. undersampled.

A Fourier transform operation tends to treat image data as if the subject were an infinite series of identical subjects at regular spacing. Structure bordering a selected field of view is transposed into the selected field of view and superimposed on the resultant image by the Fourier transform operation. That is, the Fourier transform "assumes" that the selected field of view and the adjoining fields of view contain identical samples and superimposes the images. This superimposed out-of-field-of-view structure is denoted herein as roll-over aliasing. In the cardiac imaging example in which only the central patient portion with the heart is imaged, patient data from the portion of the patient above the undersampled data and from below the portion of the patient corresponding to the undersampled data becomes superimposed on the resultant image as artifacts. Various techniques have been utilized for suppressing these artifacts.

In presaturation, RF pulses are applied prior to the main imaging sequence to saturate spins in the image slice that are located outside the desired region of interest. In the above cardiac example, the presaturation pulses saturate the spins of tissue above and below the central portion of the patient in which the heart is located corresponding to the undersampled region. The imaging procedure is performed immediately following presaturation while the spins are still saturated. Because the spins in the presaturated region have only a very short time to recover longitudinal magnetization, they contribute very little signal to the resultant image data set, reducing the alias signal.

In selective volume techniques, two or more radio frequency pulses are applied to excite and refocus the magnetization in only a preselected region of interest. In an exemplary embodiment, 90° and 180° radio frequency pulses are applied with slice select gradients on each of two axes in a spin echo sequence. Only the material in the volume seeing both RF pulses, i.e. the intersection of the two orthogonally defined regions, generates a signal with the appropriate phase history to be refocused during data collection.

In the selective undersampling technique, the region of interest is centered on the zero phase encode axis. The zero phase encode view has the most energy of all of the views with the highest phase encode view having the least. By having the region of interest correspond to the central views, the views with the most energy per view are imaged and the relatively weak views are not. Because most of the energy or signal magnitude is located at the central views of the raw data set, most of the energy does not alias—it is fully sampled. Intrinsically, the unsampled, high frequency information does alias. There is no suppression of this high spatial frequency information. However, the high spatial frequency information is of a sufficiently lower energy level or signal magnitude that the aliasing which it contributes to the resultant image is relatively weak and hard to discern.

These three techniques each have disadvantages. The selective volume technique is limited to RF spin echo sequences. Such spin echo sequences require two RF pulses as opposed to the single RF pulse used for field echoes. Thus, spin echoes are inherently less well suited to high speed imaging than field echoes. Further, they tend to require much higher specific absorption rates than field echoes. The selective volume techniques are also subject to imperfect slice profiles along the phase encoding/slice select direction. This results in image non-uniformity. A compensation is made by phase encoding for larger than the ideal field of view which results in a less than optimal reduction in the minimum number of phase encoding views.

The presaturation pulse techniques are subject to imperfect slice profiles which gave rise to non-uniformities in the undersampled regions. They are also subject to imperfect radio frequency calibration which gives rise to incomplete suppression of aliased information. When only a single preparatory presaturation pulse is applied prior to the acquisition of the entire raw data set, there may be a significant recovery of longitudinal magnetization causing significant levels of aliasing. If more than one presaturation pulse is used, e.g. one pulse before each phase encoding view, the gradient demands and specific absorption rates are vastly increased. The presaturation pulses are subject to imperfect calibration of radio frequency pulses which can result in inadequate alias suppression. Moreover, the side lobes of the presaturation pulses can themselves produce artifacts and non-uniformities within the image region of interest.

Selective undersampling makes no attempt to prevent the aliasing of high spatial frequency information. The lower energy levels at the high spatial frequency information in the central views tend to make the artifacts more subtle and difficult to distinguish from genuine structure creating more uncertainty as to the diagnostic interpretation of the resultant image. Moreover, the resolution information corresponding to the non-sampled high spatial frequencies is lost.

The present invention contemplates a new and improved technique for suppressing aliasing in undersampled data.

SUMMARY OF THE INVENTION

In accordance with the present invention, an undersampled data set is collected which corresponds to a selected subregion of a field of view. The undersampled data set inherently includes roll-over aliasing artifacts corresponding to structure within the field of view but outside of the selected subregion. When the undersampled data set is reconstructed into an image representation, it includes artifacts from regions of the field of view outside of the selected subregion. A second image representation is generated from a set of data that at least in part includes data corresponding to a second subregion of the field of view outside of the selected subregion. Portions of the second image representation that correspond to the aliasing artifacts in the first image are subtracted from the first image representation to produce an aliasing artifact corrected image representation.

In accordance with a more limited aspect of the present invention, the second image representation is generated from a fully sampled set of data of the field of view taken contemporaneously with the undersampled data set.

In accordance with another aspect of the present invention, the second image representation is generated from a combination of undersampled data sets.

One advantage of the present invention resides in its rapid image data collection.

Another advantage of the present invention is that it is compatible with field echoes.

Another advantage of the present invention is that it places less stringent requirements on specific absorption rate, gradient rise times, duty cycles, and radio frequency amplifiers.

Another advantage of the present invention is that alias suppression is independent of the relaxation rates of tissues being imaged.

Yet another advantage of the present invention is that it suppresses aliasing over a full range of spatial frequencies.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts and in various steps and arrangements of steps. The drawings are only for purposes of illustrating a preferred embodiment and are not to be construed as limiting the invention.

FIGS. 2A-2E illustrate the evolution of a corrected undersampled image in which FIG. 2A represents a fully sampled data set, FIG. 2B represents an undersampled data with aliasing artifacts; FIG. 2C represents portions of FIG. 2A corresponding to the aliasing artifacts; FIG. 2D represents an aliasing correction image prepared by translating and combining the image portions of FIG. 2C; and FIG. 2E represents the aliasing corrected undersampled image achieved by subtracting FIG. 2D from FIG. 2B.

DETAILED DESCRIPTION OF THE PREFERRED EMBODIMENTS

Figure 1A:
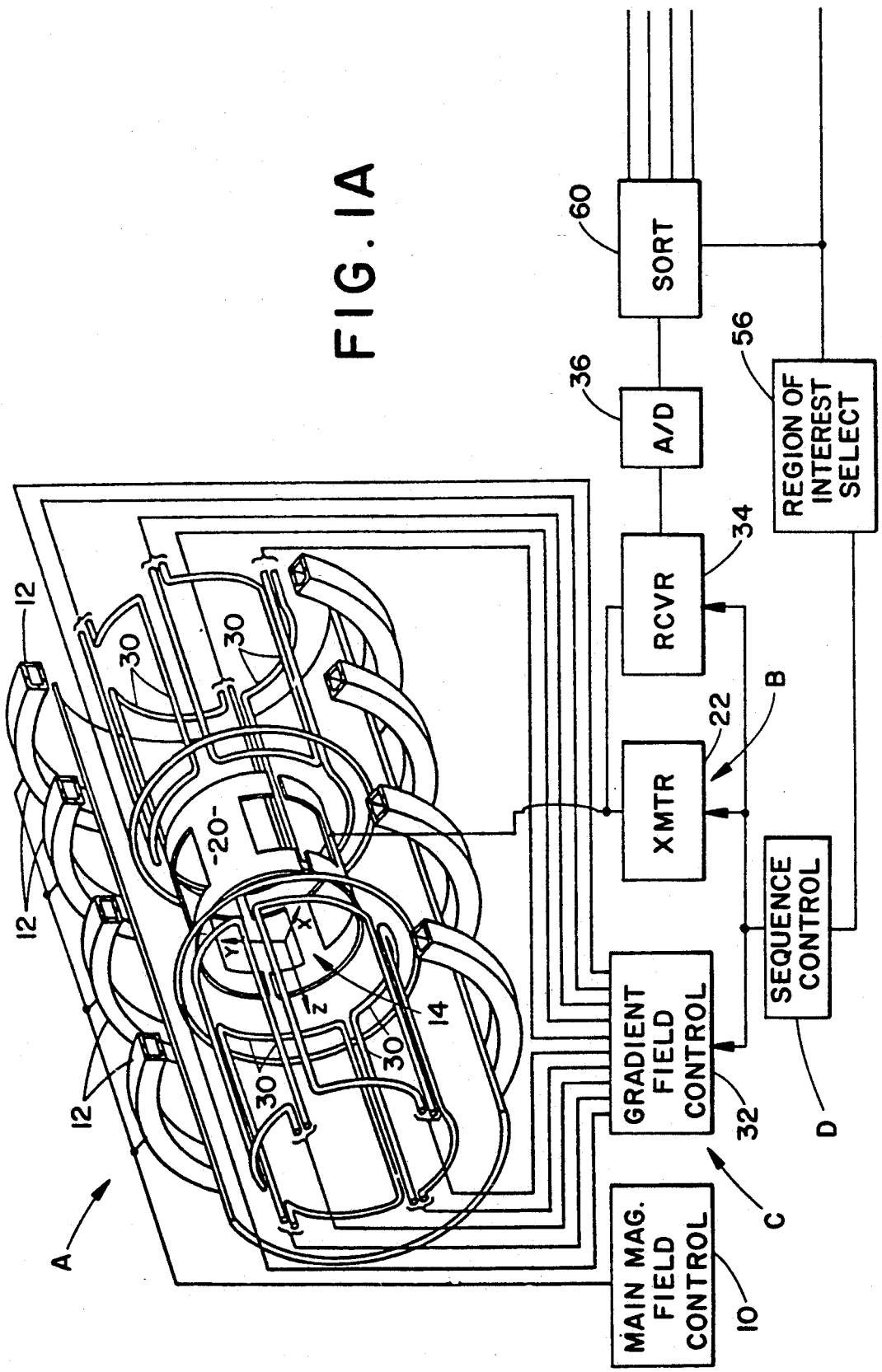
FIGS. 1A and 1B taken together are a diagrammatic illustration of a magnetic resonance scanner system in accordance with the present invention.
Figure 1B:
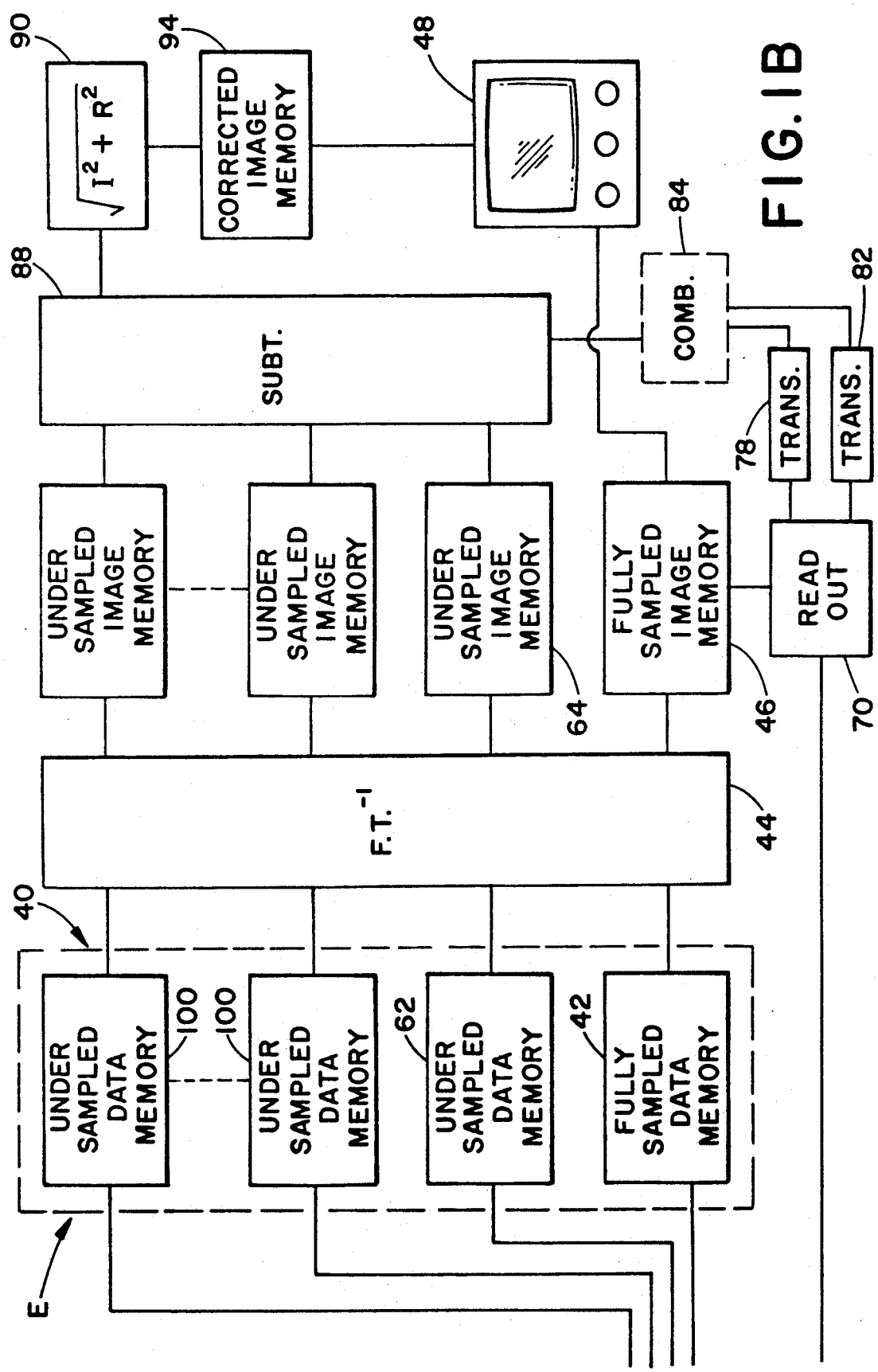

With reference to FIGS. 1A and 1B, a magnetic resonance imaging apparatus includes a main magnetic field means A for generating a substantially uniform magnetic field through an examination region. A radio frequency means B selectively transmits radio frequency excitation pulses for exciting selected dipoles within the region of interest. The radio frequency means also provides radio frequency pulses for selectively rotating or otherwise manipulating the selected components of the magnetization, e.g. selective 90° pulses, 180° pulses, or the like. A gradient field means C selectively applies gradient fields, preferably along three selectable orthogonal axes across the examination region. A pulse sequence control means D controls the radio frequency means in the gradient field means to cause the generation of preselected pulse sequences, preferably gradient echo sequences. An image means E processes received magnetic resonance signals or views and reconstructs an electronic image representation for archiving, display on a video monitor, or the like.

The magnetic field means A includes a control circuit 10 and a plurality of superconducting or resistive coils 12 for generating the magnetic field. The control circuit causes the magnets to generate a substantially uniform magnetic field axially therethrough, particularly in a centrally located examination or image region 14. Magnetic field shimming devices (not shown), as are conventional in the art, may be provided for improving the uniformity of the magnetic field.

The radio frequency means B includes a radio frequency coil 20 such as a quadrature coil which surrounds the examination region 14. A radio frequency transmitter 22 selectively applies radio frequency pulses to the RF coil to excite and manipulate magnetic resonance of the magnetization of selected dipoles in the examination region.

The gradient field means C includes gradient coils 30 for causing gradients across the main magnetic field at selectable angles. A gradient field control means 32 applies current pulses to the gradient coils to cause gradients along the three orthogonal axes, commonly designated as slice select, read, and phase encode axes or directions. The gradient field control commonly causes a linear gradient along the read axis to cause a linear frequency encoding in the read direction. Along the phase encode axis, the gradient field control means applies phase encode gradients that change in magnitude in regular steps or increments with each sequence, repetition, or view. Commonly, the phase encoding varies from zero or no phase encoding at a central view in regular steps to a maximum positive phase encoding and in analogous regular steps from the zero phase encoding to a negative maximum phase encoding. Conventionally, the number of phase encoding steps or views that are acquired is an even power of two, such as 32, 64, 128, or the like. The size of the steps of the phase encode gradient are selected such that the views from the maximum negative to the maximum positive phase encode view span a selected field of view. The gradient along the slice select direction may be applied to define a single slice or may be stepped analogous to the gradients along the phase encode axis to define multiple slices or volumes.

The radio frequency means B also includes a radio frequency receiver 34 that receives magnetic resonance signals at least during an induced magnetic resonance echo. The magnetic resonance signal or view from the receiver is digitized by an analog-to-digital converter 36 to produce the individual elements of a digital data line or view. Typically, the analog-to-digital converter digitizes the analog magnetic resonance signals by an even power of two, e.g. 32, 64, 128, 256, etc. samplings. The sampling rate and the slope of the read gradient are selected such that the digital data line or view spans the selected field of view in the read or frequency encode direction. Typically, a square field of view such as 128×128 is selected in which the number of views matches the number of digitized elements within each view. However, it is to be appreciated that the invention is also applicable to the acquisition of data in rectangular and other non-square arrangements.

With continuing reference to FIGS. 1A and 1B and further reference to FIG. 2A, the sequence control means D causes the gradient control means 32 and radio frequency transmitter 34 to generate a fully sampled set of magnetic resonance data. That is, the analog-to-digital converters 36 digitize each view N times. In each sequence repetition, the phase encode gradients assume each step between $-((N/2)-1)$ and $N/2$. A resonance data memory 40 includes fully sampled data memory 42 for storing the fully sampled complex data set. A Fourier transform means 44, preferably a fast Fourier transform means, Fourier transforms the fully sampled resonance data set into a fully sampled complex image representation whose real and imaginary components are stored in a fully sampled image memory 46. Suitable hardware and software for performing the Fourier transform function are illustrated in U.S. Pat. No. 4,749,411. A video monitor 48 selectively displays the fully sampled image representation as an image 50. Conventionally, the image is the square root of the sum of the squares of the real and imaginary image data values corresponding to each picture.

Utilizing cardiac imaging by way of example, the image 50 includes an outline 52 of the patient's torso, and an outline 54 of the patient's heart. Although the slice includes the tissue detail within the torso outline 52 and within the heart outline 54, this detail has been omitted from FIG. 2 for simplicity of illustration. A subregion of interest selection means 56 is utilized to designate boundaries 58a, 58b of a selected portion of the field of view or a subregion of interest. Preferably, the subregion of interest is defined by N/2, N/4, N/8, or some other fraction of the views which is an even power of two to facilitate the use of the preferred fast Fourier transform means. A subregion which is not an even power of two may be processed by a fast Fourier transform means with the technique and hardware illustrated in U.S. Pat. No. 4,748,411. The subregion of interest selection means 56 controls the sequence control means D such that the phase encode views between the designated field of view portion boundaries 58a and 58b are generated and channelled by a sorting means 60 into an undersampled data memory means for portion 62 of the resonance data memory 40. The fast Fourier transform means 44 Fourier transforms the undersampled data set into an undersampled image representation that is stored in an undersampled image memory 64.

If the magnitude of the undersampled image representation in the memory 64 were displayed on the video monitor, an image 66 would be produced. With reference to FIG. 2B, the image 66 includes side portions 52a and 52b of the torso and the full periphery 54 of the heart. However, as discussed in the "Background of the Invention" portion of the application, a top portion 52c of the torso periphery from above the boundary 58a is rolled-over into the undersampled image 66 and becomes an objectionable aliasing artifact that is superimposed on the cardiac image. The tissue structure defined within the boundary 58a and the upper periphery 52c of the patient's torso is also rolled-over and superimposed on the undersampled image. This same roll-over artifacting causes a lower periphery 52d of the patient's torso and tissue between the boundary 58b and the lower periphery of the torso to be rolled-over into and superimposed on the undersampled image 66. Because the tissue represented inside of the cardiac periphery 54 is now the superimposition of the cardiac tissue and portions of the upper and lower torso, the diagnostic value of the undersampled image is compromised. The subregion of interest designating routine 56 controls a fully sampled image memory read-out means or memory controller 70 to read out portions 72 and 74 of the fully sampled image 50. Image portion 72 is the portion of image 50 above boundary 58a and image portion 74 is the portion of image 50 below boundary 58b. The read-out means 70 reads out the upper image portion 72 into a translating means 78 that translates the upper image 72 downward such that its lower surface 80 has the same physical position as boundary 58b, i.e. the lowermost surface of the undersampled image 66. The read out means channels the lower image portion 74 to a translate means 82 which translates the position of the lower image portion 74 such that its upper most surface is shifted to the position of the boundary 58a, i.e. the uppermost edge of the undersampled image 66. Optionally, an adding means 84 may add the upper and lower image portions 72 and 74 together to form a composite correction image 86 (FIG. 2D).

An image correction means e.g. a subtraction device or routine 88, subtracts the real and imaginary components of the composite correction image 86, or the upper and lower image portions 72 and 74 individually, from the corresponding real and imaginary components of the undersampled image 66. A magnitude image means 90 calculates a magnitude of each pixel of a corrected undersampled image 90 from the square root of the sum of the squares of the corresponding real and imaginary values. The corrected, undersampled image is stored in a corrected undersampled image memory 94.

With reference to FIG. 2E, the subtraction device or routine 88 removes the roll-over artifacts such that the tissue within the heart periphery 54 represents only heart tissue and is not the superimposition of tissue from upper and lower portions of the torso. If appropriate, the adding means, e.g. an adder 84, can adjust the magnitude of the composite correction image 86.

In the cardiac imaging embodiment, it is often desirable to obtain a series of high speed, freeze frame images of the heart. To this end, a series of undersampled data memories 100 is provided for receiving subsequent undersampled images at short time displaced intervals after the initial time displaced image. Rather than providing separate undersampled image memories, a single undersampled image data memory may be provided and used serially if the processing speed of the Fourier transform means 44 and other hardware permit. The series of resultant corrected undersampled images are stored in the corrected undersampled image memory 94 or other memory means.

The composite correction image 86 may be utilized as long as it remains a valid correction, generally for one respiratory cycle. Typically, the patient holds his breath while a series of cardiac images are taken. As long as the tissue above boundary 58a and below boundary 58b of image 50 remain stationary, the composite correction image 86 remains valid. Pulmonary motion typically moves this tissue. Accordingly, a new fully sampled image is preferably taken each respiratory cycle.

Although the method has been described as generating the fully sampled data set first for convenience of illustration, it is to be appreciated that the fully sampled data set may be taken at any time in the series of high speed undersampled images including at the beginning of the series, at the end of the series, at one point during the series, or distributed over the series. Indeed, the data corresponding to the phase encode views between the boundaries 58a and 58b of the fully sampled image may be channelled by the sorting means 60 to both the undersampled image memory 62 and the fully sampled image memory 42 to be processed as one of the series of high speed cardiac images.

In another implementation of the present invention, the collection of the fully sampled data set is distributed over the series of undersampled data sets. For example, the first undersampled image may be a first fraction of the phase encode views between $-((N/2-1))$ and $N/2$, e.g. every fourth view. The second undersampled image may be a different quarter of the views and so on for the third and fourth undersampled views. Although each of the four data sets is undersampled, cumulatively they comprise a fully sampled data set. In this embodiment, the sorting means 60 directs each of the undersampled views to one of the undersampled image memories as well as to the fully sampled image memory 42 which accumulates all four views into the fully sampled data set. The above described Fourier transform and subtraction procedure is repeated to generate four time displaced, corrected undersampled views.

The invention has been described with reference to a preferred cardiac imaging embodiment. It is to be appreciated that the invention not only finds application in other diagnostic imaging applications but in other imaging and signal processing areas that have roll-over type aliasing. Numerous alterations, modifications and further applications will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of magnetic resonance imaging comprising:
   positioning a subject in a strong magnetic field;
   applying radio frequency and gradient magnetic field pulses to at least a portion of the subject in the magnetic field to generate a fully sampled data set including a plurality of phase encoded magnetic resonance views which span a field of view;
   collecting the fully sampled data set and an undersampled data set, the undersampled data corresponding to a selected portion of the field of view spanned by the fully sampled data set;
   transforming the undersampled data set into an undersampled image representation, which undersampled image representation includes a roll-over aliasing contribution from a substance located within the field of view outside the selected portion;
   transforming the fully sampled data set into a fully sampled image representation;
   subtractively combining the undersampled image representation and at least one portion of the fully sampled image representation representing the substance located within the field of view outside of the selected portion to produce a corrected undersampled image representation;
   converting the corrected undersampled image representation into a human-readable image display.

2. The method as set forth in claim 1 wherein the corrected undersampled image representation has real and imaginary components and further including calculating magnitude values from the real and imaginary components and producing the human-readable display from the magnitude values.

3. The method as set forth in claim 1 further including:
   collecting additional undersampled magnetic resonance data sets that correspond to said selected portion of the field of view;
   Fourier transforming the additional undersampled data sets into additional undersampled image representations;
   subtractively combining the additional undersampled image representations with the portion of the fully sampled image representation corresponding to the substance within the field of view outside the selected portion to create a plurality of corrected undersampled images.

4. The method as set forth in claim 3 wherein the field of view includes a patient's torso and the selected portion corresponds to a region of the patient including its heart and wherein the steps of collecting a plurality of undersampled data sets includes collecting each of the undersampled data sets at a different time such that the corrected undersampled images represent a series of images through the patient's heart at time displaced intervals.

5. A magnetic resonance method comprising:
   positioning a subject in a magnetic field;
   applying radio frequency and gradient magnetic field pulses to at least a portion of the subject in the magnetic field to generate a plurality of phase encoded magnetic resonance views of a plurality of undersampled data sets, which plurality of undersampled data sets taken together span a field of view;
   combining the plurality of undersampled data sets to generate a field of view spanning data set;
   transforming the one of undersampled data sets corresponding to a selected portion of the field of view into an undersampled image representation, which undersampled image representation includes a roll-over aliasing contribution from a substance located within the field of view outside the selected portion;
   transforming the field of view spanning data set into a field of view image representation;
   subtractively combining the undersampled image representation and at least one portion of the field of view image representation representing the substance located within the field of view outside of the selected portion to produce a corrected undersampled image representation.

6. A method of frequency and phase encoded data processing comprising:
   positioning a subject in a magnetic field;
   applying radio frequency and gradient magnetic field pulses to at least a portion of the subject in the magnetic field to generate a plurality of phase encoded magnetic resonance views which span a field of view;

creating at least one undersampled data set from the plurality of views, the undersampled data set corresponding to a selected portion of the views which span the field of view;

transforming the undersampled data set into an undersampled transformed data set;

transforming the views which span the field of view into a field of view transformed data set;

subtractively combining the undersampled transformed data set with portions of the field of view transformed data set which correspond to portions of the field of view that are not common with the undersampled data set to produce a corrected undersampled data set.

7. A method of processing frequency and phase encoded data into an image, the method comprising;

positioning a subject in a strong magnetic field;

applying radio frequency and gradient magnetic field pulses to at least a portion of the subject in the magnetic field in a field echo imaging sequence to generate a plurality of phase encoded magnetic resonance views;

collecting the magnetic resonance views and assembling at least one undersampled data set and at least one substantially fully sampled data set, the undersampled data set corresponding to a selected portion of the fully sampled data set;

transforming the fully sampled and undersampled data sets into undersampled and fully sampled transformed data sets;

subtractively combining the undersampled transformed of the fully sampled transformed data set which correspond to portions of the fully sampled data set that are not common with the undersampled data set to produce a correct undersampled data set; and converting the corrected undersampled data set into a human-readable image display.

8. The method as set forth in claim 7 wherein the transforming step includes Fourier transforming the data sets.

9. A method of processing phase and frequency encoded magnetic resonance data, the method comprising:

positioning a subject in a magnetic field;

applying radio frequency and gradient magnetic field pulses of a gradient echo magnetic resonance sequence to at least a portion of the subject in the magnetic field to generate at least one undersampled magnetic resonance data set and at least one fully sampled magnetic resonance data set, the undersampled data set corresponding to a selected portion of the fully sampled data set;

transforming the fully sampled and undersampled data sets into undersampled and fully sampled transformed data sets;

subtractively combining the undersampled transformed data set with portions of the fully sampled transform data set which correspond to portions of the fully sampled data set that are not common with the undersampled data set to produce a corrected undersampled data set.

10. A method of imaging comprising;

positioning a subject in a magnetic field;

applying radio frequency pulses and gradient magnetic fields to at least a portion of the subject in the magnetic field to generate a plurality of phase encoded magnetic resonance data;

collecting a substantially fully sampled data set corresponding to a field of view through a selected region of interest of a subject and collecting an undersampled data set corresponding to a selected portion of the field of view;

transforming the fully sampled data set into a fully sampled image representation corresponding to the field of view;

transforming the undersampled data set into an undersampled image representation that corresponds to a selected portion of the field of view which undersampled image representation includes rollover aliasing representing contributions of areas of the subject within the field of view outside the selected portion;

subtractively combining the undersampled image representation with portions of the fully sampled image representation to cancel the roll-over aliasing.

11. A magnetic resonance imaging apparatus comprising:

a means for creating a main magnetic field through a region of interest;

a means for applying gradient and radio frequency pulses across the region of interest to excite magnetic resonance of selected dipoles of a portion of a subject in the examination region;

a receiving means for receiving phase and frequency encoded magnetic resonance data;

an analog-to-digital converting means for converting each of a plurality of phase encoded analog magnetic resonance signals into a corresponding plurality of digital views, each view with a corresponding phase encoding;

a data storing means for storing (i) a plurality of digital views, each corresponding to one of a preselected plurality of phase encodings that span a field of view and (ii) a plurality of undersampled views which correspond to only a fraction of the complete set of phase encodings;

a Fourier transform means for transforming data in the data storing means into an undersampled image memory means and a fully sampled image memory means;

a subtracting means for subtracting a portion of data in the fully sampled image memory means from data in the undersampled image memory means to create a corrected image representation; and, a display means for producing a man-readable display with a corrected image representation.

12. A signal processing apparatus comprising:

a means for generating a strong magnetic field;

a means for applying radio frequency and gradient magnetic field pulses to at least a portion of a subject in the magnetic field to generate a plurality of frequency encoded complex data lines;

a first memory means for storing a fully sampled set of the data lines;

a second memory means for storing a fraction of the fully sampled set of the data lines;

a transform means for transforming the complex data lines from the first and second memory means into fully sampled and undersampled transformed data, respectively;

a subtraction means for subtractively combining the undersampled transformed data with a portion of the fully sampled transformed data to produce corrected undersampled transformed complex data for storage in a corrected undersampled data memory means.

13. A magnetic resonance apparatus comprising:
   means for generating a main magnetic field;
   means for applying gradient magnetic fields and radio frequency pulses across the examination region to induce magnetic resonance of selected dipoles in the examination region;
   a receiver means for receiving magnetic resonance signals emanating from the examination region and producing a plurality of frequency encoded complex data lines;
   a first memory means for storing a fully sampled set of the complex data lines;
   a second memory means for storing a fraction of the fully sampled set of the complex data lines;
   a transform means for transforming the complex data lines from the first and second memory means into fully sampled and undersampled transformed data, respectively;
   a subtraction means for subtractively combining the undersampled transformed data memory with a portion of the fully sampled transformed data to produce corrected undersampled transformed complex data from storage in a corrected undersampled data memory means.

14. The apparatus as set forth in claim 13 further including:
   a means for generating magnitude values from the complex corrected undersampled transformed complex data;
   a display means for converting the magnitude values into a man-readable image.

15. The apparatus as set forth in claim 13 further including a plurality of undersampled data memory means for storing a plurality of undersampled data sets to be transformed by the transform means into a corresponding plurality of transformed undersampled image data, each of which is subtractively combined by the subtraction means with a portion of the data fully sampled transformed data.

16. The apparatus as set forth in claim 14 wherein the fully sampled transformed data set has a first portion that corresponds to the undersampled transformed data set and at least one second portion which does not correspond to the undersampled transformed data set and further including:
   means for identifying the second portion of the fully sampled data region and transferring the second portion to the subtracting means.

17. The apparatus as set forth in claim 16 further including a translating means for translating the at least one identified second portion before it is transferred to the subtracting means.

* * * * *